United States Patent [19]

Sturges

[11] Patent Number: 5,333,139
[45] Date of Patent: Jul. 26, 1994

[54] METHOD OF DETERMINING THE NUMBER OF INDIVIDUAL INTEGRATED CIRCUIT COMPUTER CHIPS OR THE LIKE IN A BOUNDARY SCAN TEST CHAIN AND THE LENGTH OF THE CHAIN

[75] Inventor: Jay J. Sturges, Orangevale, Calif.
[73] Assignee: Intel Corporation, Santa Clara, Calif.
[21] Appl. No.: 998,545
[22] Filed: Dec. 30, 1992
[51] Int. Cl.$^5$ .............................................. G06F 13/00
[52] U.S. Cl. .................................. 371/22.3; 371/22.1
[58] Field of Search .................... 371/22.3; 377/20; 324/158 R, 73.1

[56] References Cited

U.S. PATENT DOCUMENTS

| | | | |
|---|---|---|---|
| 5,079,725 | 1/1992 | Geer et al. | 364/550 |
| 5,155,732 | 10/1992 | Jarwala et al. | 371/22.3 |
| 5,173,904 | 12/1992 | Daniels et al. | 371/22.3 |
| 5,185,745 | 2/1993 | Marca, Jr. | 371/22.3 |

OTHER PUBLICATIONS

Fluke and Phillips Corporations, "The ABCs of Boundary-Scan Test", pp. 8-25.
Texas Instruments Corporation, "Scope System Controllability/Observability Partitioning Environment", Oct. 1992, pp. 1-15.

Primary Examiner—Robert W. Beausoliel, Jr.
Assistant Examiner—Phillip Vales
Attorney, Agent, or Firm—Blakely, Sokoloff, Taylor & Zafman

[57] ABSTRACT

A method in which the boundary-scan circuitry of a boundary-scan chain is placed in a first condition in which each bit of a series of bits will traverse a path through an equipment identification register if one exists or will require one clock to traverse each device in the boundary-scan chain in which no complete identification register exists. A first recognizable series of bits is sent through the chain and the beginning of the series of bits is detected at the output of the chain while a count is kept at the output to determine the number of individual boundary-scan circuits in the chain. The count is incremented by one for each identification register traversed or for each circuit which has no such complete register. The boundary-scan chain is then placed in a second condition in which each bit of a series of bits will traverse the instruction registers of the individual boundary-scan circuits in the boundary-scan chain, and a second recognizable series of bits is sent through the chain and counted until the a detectable portion of the second series of bits appears at the output of the boundary-scan chain. This count indicates the total number of bits in the instruction registers in the chain.

5 Claims, 5 Drawing Sheets

METHOD OF DETERMINING THE NUMBER OF INDIVIDUAL INTEGRATED CIRCUIT COMPUTER CHIPS OR THE LIKE IN A BOUNDARY SCAN TEST CHAIN AND THE LENGTH OF THE CHAIN

BACKGROUND OF THE INVENTION

1. Field of the Invention

This invention relates to integrated circuits and, more particularly, to methods for testing integrated circuits having boundary-scan test circuitry connected in a series-linked boundary test scan chain with other integrated circuits in order to determine the number of programmable integrated circuits connected in the array and the total number of register bits in the chain of boundary-scan test circuits.

2. History of the Prior Art

As integrated circuits have become physically smaller while including more and more individual elements, it has become more difficult to test those circuits. In order to assure that such circuits may be tested accurately without inordinate expense, these integrated circuits have been equipped with circuitry adapted to allow boundary-scan testing. Boundary-scan testing uses a plurality of shift register stages built into each integrated circuit. Boundary-scan controller circuitry in each integrated circuit controls the transfer of data serially from an input port to an output port through the stages of the boundary-scan shift register and allows use of the data so that circuit testing may be conducted from external terminals without the need for probes and other imprecise instruments. Boundary-scan testing makes the test process for integrated circuits so equipped faster and more accurate.

An industry standard has been implemented for boundary-scan test operations which allows the boundary-scan test circuitry of a plurality of integrated circuits from different manufacturers to be connected in a serial chain within an electronic system. This standard is described in an industry specification, IEEE JTAG 1149.1 ("the Standard"). The Standard provides a protocol by which various test functions may be accomplished through specified test ports defined by the specification. Essentially, the Standard outlines the details of the serial path of linked test registers (called a boundary-scan register chain) through the integrated circuits and defines the controllers in each integrated circuit. The linked serial path of the boundary-scan register chain allows data to be transferred to various test and other registers within any of the integrated circuits. From these registers, various operations may be conducted by the controllers with the specific integrated circuits.

One problem that has arisen for manufacturers in implementing the testing has been the need to know the length of the boundary-scan chain and the number of individual integrated circuits in that chain. Unless these facts are known, it is impossible to provide instructions and data to the desired boundary-scan circuitry to correctly test any specific integrated circuit. To date, that knowledge has had to be furnished by the manufacturer of the system before boundary-scan testing of a particular integrated circuit could be conducted.

SUMMARY OF THE INVENTION

It is, therefore, an object of the present invention to provide a method for determining the position of a particular integrated circuit in a boundary-scan test chain.

It is a more specific object of the present invention to provide a method for determining the number of register bits in a boundary-scan test chain.

It is another more specific object of the present invention to provide a method to determine the number of circuits connected in a boundary-scan test chain.

These and other objects of the present invention are realized in a method in which the boundary-scan circuitry of a boundary-scan chain is placed in a first condition in which each bit of a series of bits in a signal will traverse a path through an equipment identification register if one exists or will require one clock to traverse each device in the boundary-scan chain in which no identification register exists. A first recognizable series of bits is sent through the chain and the beginning of the series of bits is detected at the output of the chain. A count of the number of bits furnished to the chain is kept to determine the number of individual boundary-scan circuits in the chain, and the count is incremented one for each identification register traversed or for each circuit which has no such register. The boundary-scan chain is then placed in a second condition in which each bit of a series of bits will traverse the instruction registers of the individual boundary-scan circuits in the boundary-scan chain, and a second recognizable series of bits is sent through the chain and counted until the a detectable portion of the second series of bits appears at the output of the boundary-scan chain. This count describes how many bits appear in all of the instruction registers in the chain.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method for operating a computer in processing electrical or other (e.g. mechanical, chemical) physical signals to generate other desired physical signals.

DETAILED DESCRIPTION

Figure 1:
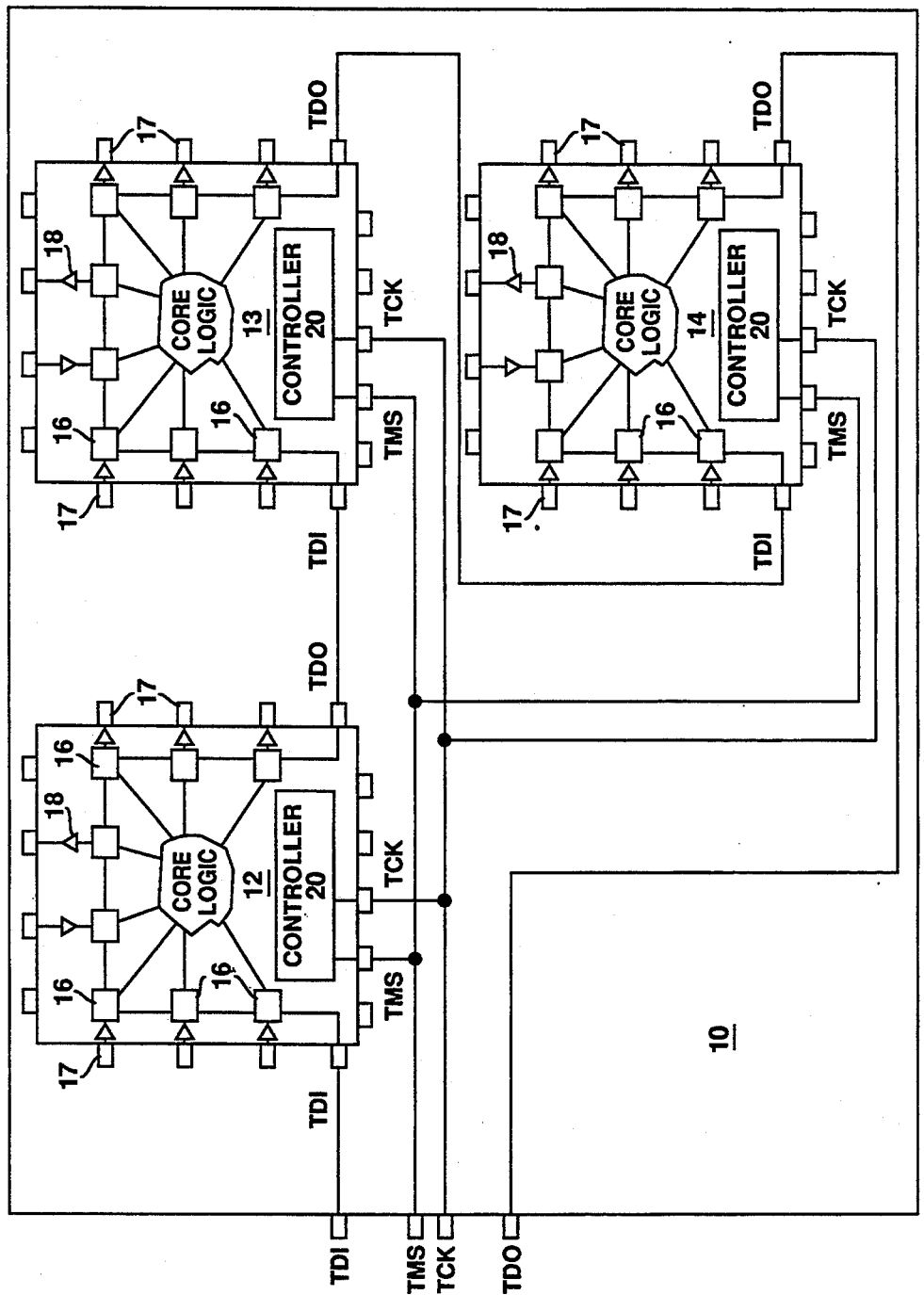
FIG. 1 is a block diagram illustrating an arrangement of integrated circuits having boundary-scan testing facilities in accordance with the prior art.
Figure 2:
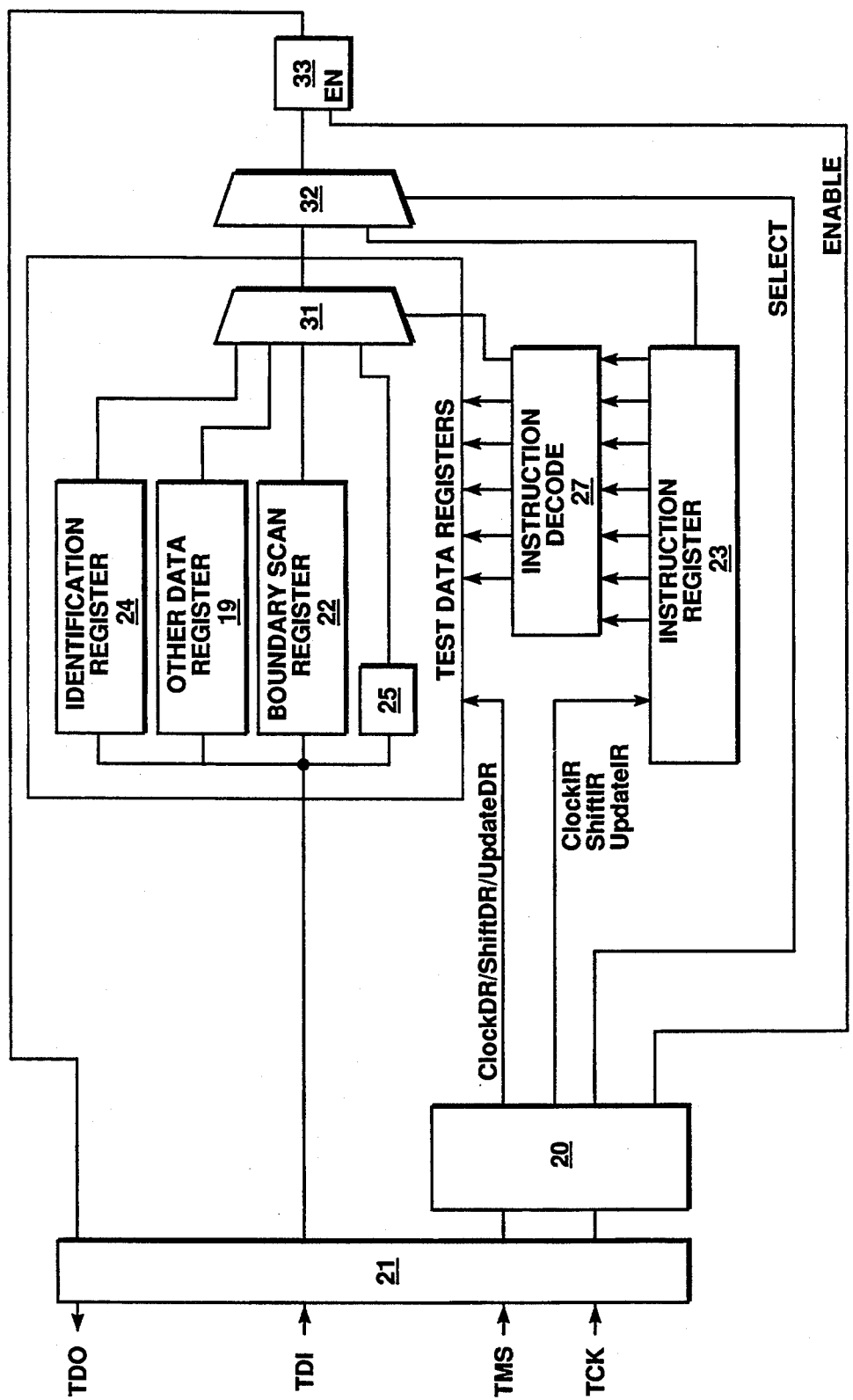
FIG. 2 is a block diagram illustrating the boundary-scan circuitry architecture for a particular integrated circuit in accordance with the prior art.
Figure 3:
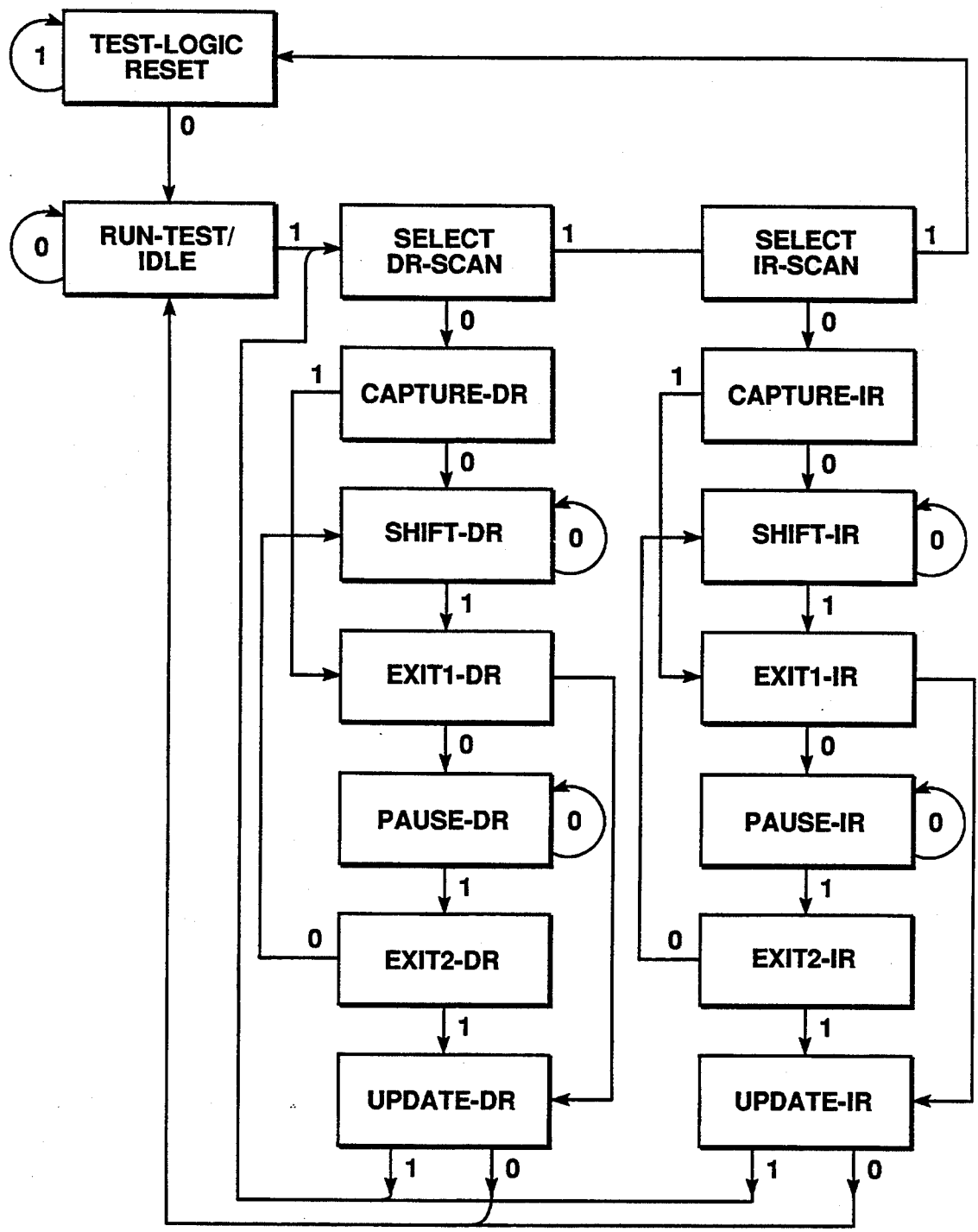
FIG. 3 is a state diagram illustrating the operation of a controller for boundary-scan circuitry illustrated in FIGS. 1 and 2.

FIG. 1 is a block diagram illustrating an electronic system 10 which includes boundary-scan test circuitry designed in accordance with the Standard. This figure as well as FIGS. 2 and 3 are modifications of figures included in "*The ABCs of Boundary-Scan Test,*" a 1991 publication of Fluke and Philips Test Measurement Alliance. This publication explains boundary-scan testing at length.

The system 10 includes three individual integrated circuits 12, 13, and 14 (although circuits other than integrated circuits might also be included) which are joined in a boundary-scan arrangement. The integrated circuits 12, 13, and 14 may be various related circuits mounted on a particular printed circuit board and connected through various conductors (not shown) to carry out their prescribed functions. For example, these circuits may form some portion of a computer. The boundary-scan circuitry (which is what is illustrated in FIG. 1) is essentially identical within each of the circuits 12, 13, and 14 except for the sizes and numbers of the registers included in each circuit 12, 13, or 14.

As may be seen, the system 10 and each of the individual circuits 12, 13, and 14 has four terminals through which signals are transferred to the boundary-scan circuitry. These are a test data in (TDI) terminal, a test data out (TDO) terminal, a test mode select (TMS) terminal, and a test clock (TCK) terminal. These terminals are typically pins provided at the periphery of each of the integrated circuits and of the printed circuit board on which the circuits reside. Within each of the circuits 12, 13, and 14 are a number of individual boundary-scan cells 16. Each of the boundary-scan cells 16 is functionally one stage of a shift register within that particular integrated circuit. Each boundary-scan cell 16 may be positioned adjacent an external pin 17 on the particular integrated circuit. Data may be provided to or received from a cell 16 at the pin 17 through a buffer stage 18. Each boundary-scan cell 16 may also be connected to provide or accept data from core logic circuitry within the integrated circuit 12, 13, or 14.

Thus, the boundary-scan cells 16 of any of the circuits 12, 13, and 14 are joined in a series chain within the particular integrated circuit. One end of the boundary-scan chain formed within each of the circuits 12, 13, and 14 is effectively joined to the TDI terminal for that one of the circuits 12, 13, and 14 and the other end of the chain is effectively joined to the TDO terminal of that particular circuit. The TDO terminal of each one of the circuits 12, 13, and 14 is connected to the TDI terminal of the next circuit in the chain so that a large serial chain of all of the boundary-scan cells 16 of all of the circuits 12, 13, and 14 exists.

Each of the circuits 12, 13, and 14 includes a boundary-scan controller circuit 20 which controls the transfer of data through the various stages of the shift register formed by the boundary-scan cells 16 within that circuit. Each of the boundary-scan controller circuits of the circuits 12, 13, and 14 receives the signals provided at the TMS and the TCK terminals in parallel with the controllers 20 of the others of those circuits 12, 13, and 14. The boundary-scan controller circuit 20 of each of the circuits 12, 13, and 14 controls the transfer of instructions and data through the boundary-scan circuitry and the transfer of data between the boundary-scan circuitry and the other circuitry of the particular one of the circuits 12, 13, and 14.

FIG. 2 illustrates the architecture of typical boundary-scan circuitry within any one of the circuits 12, 13, and 14 designed in accordance with the Standard. As may be seen, the boundary-scan circuitry includes an input port 21 through which the signals at the TDI, TDO, TMS, and TCK terminals are transferred. The signals at the TDI terminal may be transferred to either the boundary-scan register 22 defined by the boundary-scan cells 16, to some other data register 19, or to an instruction register 23 under control of the signals appearing at the TMS terminal. In particular integrated circuits, the other register 19 may include a number of additional registers. Also connected in parallel with the aforementioned registers is a device identification (ID) register 24 which may contain a twelve bit value identifying the particular integrated circuit; where no identification number is provided, a single stage register storing a zero value is provided instead. As will be understood, the boundary-scan register 22, the instruction register 23, and any other registers (not including the identification registers 24 which are always twelve bits in length) connected in parallel therewith may be of any length depending on the number of boundary-scan stages within the particular one of the circuits 12, 13, and 14 and the size of instructions affecting that circuit. Consequently, a one bit bypass register 25 is provided to allow a one clock bypass of the particular boundary-scan circuitry of that one of the circuits 12, 13, and 14 when the testing operation is not directed to that particular one of the circuits 12, 13, and 14. Each of these different registers provides in effect a selectable shift register path though the boundary scan circuitry of the particular integrated circuit.

An instruction placed in the instruction register 23 is decoded by an instruction decode circuit 27 and controls the transfer of data through the boundary-scan circuitry. The signals on the TMS and TCK terminals are transferred to the boundary-scan controller circuit 20 which provides control signals in accordance with the state diagram of FIG. 3 to control the operation of the boundary-scan circuitry.

As may be seen, the instruction controls the operation of a multiplexer 31 which controls the data path taken through the particular portion of the boundary-scan circuitry. Control signals from the boundary-scan controller circuit 20 also control a second multiplexor 32 which selects data from the path through the instruction register 23 or the data registers 19, 22, 24, and 25. A gate 33 is enabled when the test function of the boundary-scan circuitry is enabled by the TMS signals to allow data to flow to the TDO terminal. Thus, as may be seen a serial path is provided through the boundary-scan circuitry of the particular one of the circuits 12, 13, and 14. Data may be transferred bit by bit through this serial path from the TDI terminal to the TDO terminal. By providing a selected sequence of control signals at the TMS terminal to place the controller 20 in a desired state, a path may be selectively provided through the instruction register 23, the boundary-scan register 22, the identification register 24, or the test data register 19. When the TDO terminal of one integrated circuit is connected to the TDI terminal of the next integrated circuit, a selectable serial path exists from the input terminal TDI on the printed circuit board through the boundary-scan circuitry of all of the circuits 12, 13, and 14 to the TDO terminal on the printed circuit board.

Figure 4:
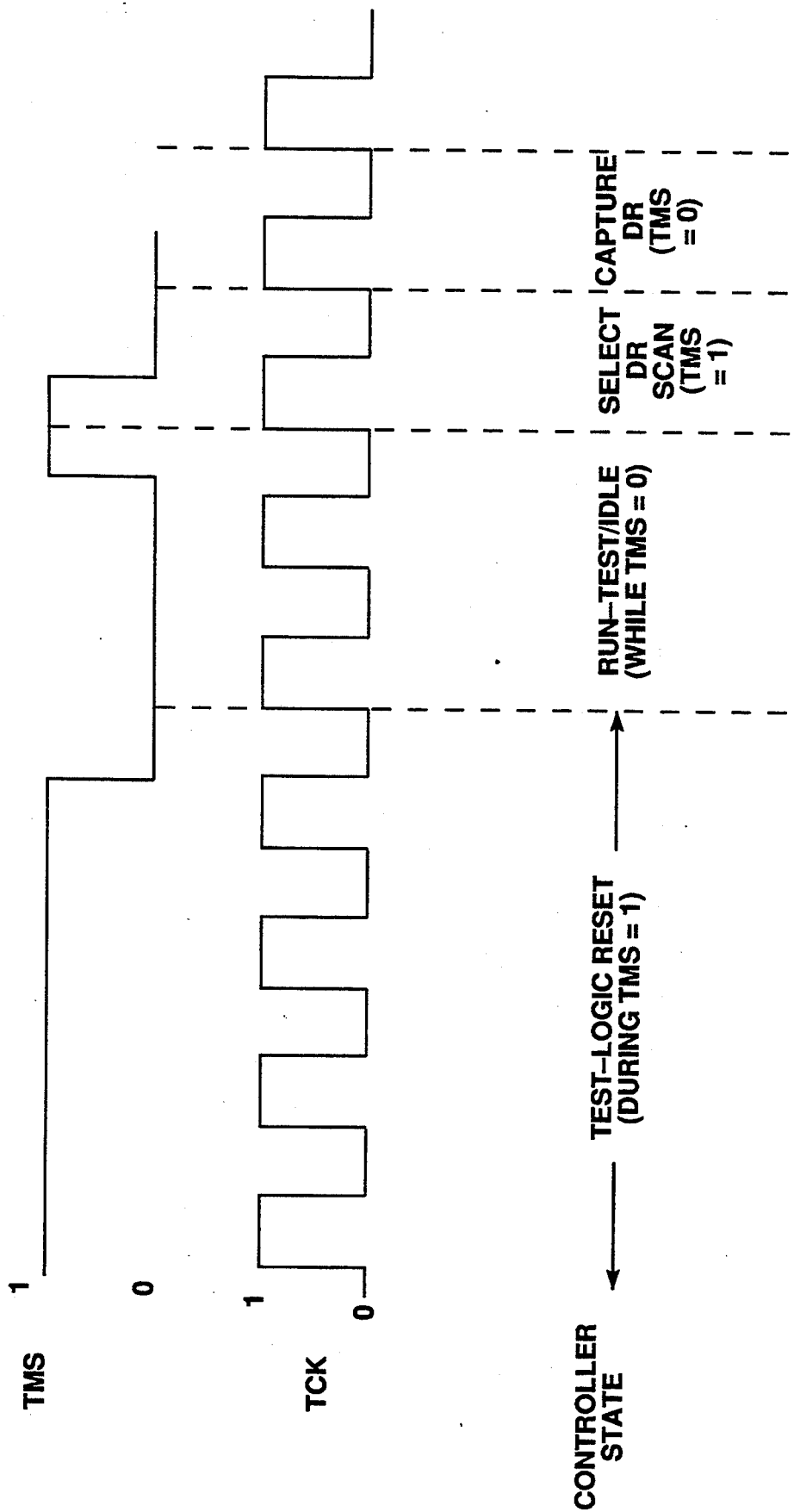
FIG. 4 is a timing diagram useful in understanding the operation of a controller for boundary-scan operations such as that defined in FIG. 3.

FIG. 3 is a state diagram defining the operation of the boundary-scan controller circuit 20 of each of the circuits 12, 13, and 14 in accordance with the Standard. FIG. 4 is a timing diagram illustrating signals provided to the controller circuit 20. The boundary-scan controller circuit 20 is a finite state machine which operates synchronously with the clock input signals TCK. All state transitions within the boundary-scan controller circuit 20 occur at the rising edge of the TCK pulse while actions in the registers and other test logic occur at either the rising or the falling edge of the TCK.

If the boundary-scan controller circuit 20 is in the Test-Logic Reset state, as long as the TMS signal is held at one, the boundary-scan controller circuit 20 remains in that state; in this state, all test logic is disabled. In this state, the path through the bypass registers 25 of all the boundary-scan circuits is enabled and the values in the instruction registers 23 are reset to zero. If the TMS signal is then set to zero, the boundary-scan controller circuit 20 leaves the Test-Logic Reset state at the rising edge of the next TCK pulse and enters the Run-Test/Idle state; while the boundary-scan controller circuit 20 remains in this state various tests may be run or instructions performed depending on the instruction value in the instruction register 23. The boundary-scan controller circuit 20 remains in the Run-Test/Idle state so long as the TMS signal is zero, but leaves that state on the rising edge of a TCK signal for a Select DR-Scan state when the TMS signal becomes a one. The boundary-scan controller circuit 20 remains in this state for only one clock interval since a TMS value of one sends it to a Select IR-Scan state while a zero sends it to a Capture-DR state. The Select DR-Scan and Select IR-Scan states are used to control the route to be followed through the state machine of the boundary-scan circuit controller 20.

If the boundary-scan controller circuit 20 is in the Capture-DR state, data may be loaded in parallel from the selected parallel input pins 17 into the shift register stages of a selected data register (e.g., 19 or 22). A TMS value of one causes the boundary-scan controller circuit 20 to shift to an Exit1-DR state. A TMS value of zero causes the boundary-scan controller circuit 20 to shift to a Shift-DR state. In the Shift-DR state, any data is shifted out to the TDO terminal by one shift register stage on the rising edge of each TCK clock signal. In the Shift-DR state, the path through the identification registers 24 of each integrated circuit is automatically selected. It should be noted that if no identification register is provided, the path selected is through the one stage register is substituted in its place. A TMS value of one causes the boundary-scan controller circuit 20 to move to the Exit1-DR state. The Exit1-DR state, like the Select DR-Scan and Select IR-Scan states, is used to control the route to be followed through the boundary-scan controller state machine. From the Exit1-DR state, the boundary-scan controller circuit 20 moves to a Pause-DR state on a TMS value of zero where it may reside during the continuation of the zero TMS value; this state provides a temporary pause in the shifting process. A TMS value of one moves the boundary-scan controller circuit 20 to an Exit2-DR state; the Exit2-DR state is also used to control the route to be followed the boundary-scan controller state machine. A TMS value of zero at the Exit2-DR state moves the boundary-scan controller circuit 20 back to the Shift-DR state while a TMS value of one moves the boundary-scan controller circuit 20 to an Update-DR state. The boundary-scan controller circuit 20 also moves to the Update-DR state from the Exit 1-DR state in response to a one TMS value.

At the Update-DR state, the data in any data register may be provided to a latched parallel output in the core logic of the particular integrated circuit 12, 13, or 14. This allows the data to be transferred from the boundary-scan circuitry to the core logic of the integrated circuit without being affected by the shifting of the boundary-scan chain.

As will be appreciated, the transfer of instruction data through the states (Capture IR, Shift IR, Exit 1 IR, Pause IR, Exit2 IR, and Update IR) succeeding the Select IR-Scan state proceeds in a manner essentially identical to that described for the data path.

As is well known, instructions and data may be furnished in serial binary form at the TDI terminal of a printed circuit board and transferred to any particular register in an integrated circuit by appropriate selection of the sequence of TMS signals. An instruction transferred to the instruction register 23 may be utilized to control data similarly furnished at the TDI terminal and transferred to a boundary-scan register 22 or another one of the data registers. An example of the operation for a particular boundary-scan controller circuit 20 follows.

The TMS signal is first set to one for a select period (e.g., five clocks) to transfer the controller 20 to the Test-Logic Reset state. In this state, the path through each boundary-scan circuit is set to the bypass registers 25; and the instruction registers are all cleared to zero. If the TMS signal is then set to a zero, the boundary-scan controller circuit 20 moves from the Test-Logic Reset state to the Run-Test/Idle state on the next clock. If in the Run-Test/Idle state the TMS signal remains a one, the boundary-scan controller circuit 20 moves to the Select DR state on the next clock. The Select-DR state allows the state machine to move to a path in which the various test registers are utilized. If the TMS signal is changed to a zero, the boundary-scan controller circuit 20 moves to the Capture-DR state on the next clock. If the TMS signal then changes to a zero, the boundary-scan controller circuit 20 moves to the Shift- DR state on the next clock. If the TMS signal then changes to a zero, the boundary-scan controller circuit 20 remains in the Shift-DR state on the next clock and shifts in the data at the TDI terminal toward the TDO terminal so long as the TMS signal remains at zero. In this state, the identification registers 24 are automatically selected. In this state any serial string of data placed at the TDI terminal will be shifted through the boundary-scan chain toward the TDO terminal including particularly the identification registers 24. For those circuits which have identification numbers, the traverse of the twelve bit register requires twelve clock periods; while for those circuit which do not have identification numbers, the traverse of the single bit register requires only one clock period.

If, when the state machine is in the Select DR-Scan state, the TMS signal remains a one rather than changing to zero, the boundary-scan controller circuit 20 moves to the Select IR-Scan state on the next clock. If the TMS signal then changes to a zero, the boundary-scan controller circuit 20 moves to the Capture-IR state on the next clock. If the TMS signal then changes to a zero, the boundary-scan controller circuit 20 moves to the Shift-IR state on the next clock. In this state, the instruction registers 23 of each boundary-scan circuit are automatically selected to provide the path through the boundary-scan chain. If the TMS signal changes to a zero, the boundary-scan controller circuit 20 remains in the Shift-IR state on the next clock and shifts any data provided at the TDI terminal one bit per clock (so long as the TMS signal remains at zero) toward the TDO terminal through a path which includes the instruction registers 23. This ultimately shifts the data to positions in the instruction register 23 so that it may be utilized as an instruction. Rather than placing data in a register for use, the data may be simply shifted through the boundary-scan circuitry of an integrated circuit out of the TDO terminal to the TDI terminal of the next integrated circuit. As may be seen, the ability to selectively move data through the boundary-scan circuitry in response to a particular sequence of TMS signals allows data to be placed in any register in the boundary-scan circuitry of an integrated circuit.

Because the individual circuits 12, 13, and 14 each have boundary-scan circuitry which may be connected in series to form long chains of boundary-scan circuitry, it is necessary to know the number of integrated circuits in the chain of boundary-scan circuitry and the number of stages in the entire boundary-scan chain including all of the integrated circuits 12, 13, and 14 in order to be able to move data an appropriate number of stages and place that data in a particular register of a particular integrated circuit in order to perform operations related to such circuit. The present invention provides a method for accomplishing this function when the circuitry is being set up if the number of integrated circuits and the register sizes for those integrated circuits connected in a boundary-scan chain with an integrated circuit which it is desired to test or otherwise manipulate is unknown. The particular integrated circuit which it is desired to test or otherwise manipulate is connected at the beginning or the end of the boundary-scan circuitry chain path in order to practice this method.

Figures 5, 6:
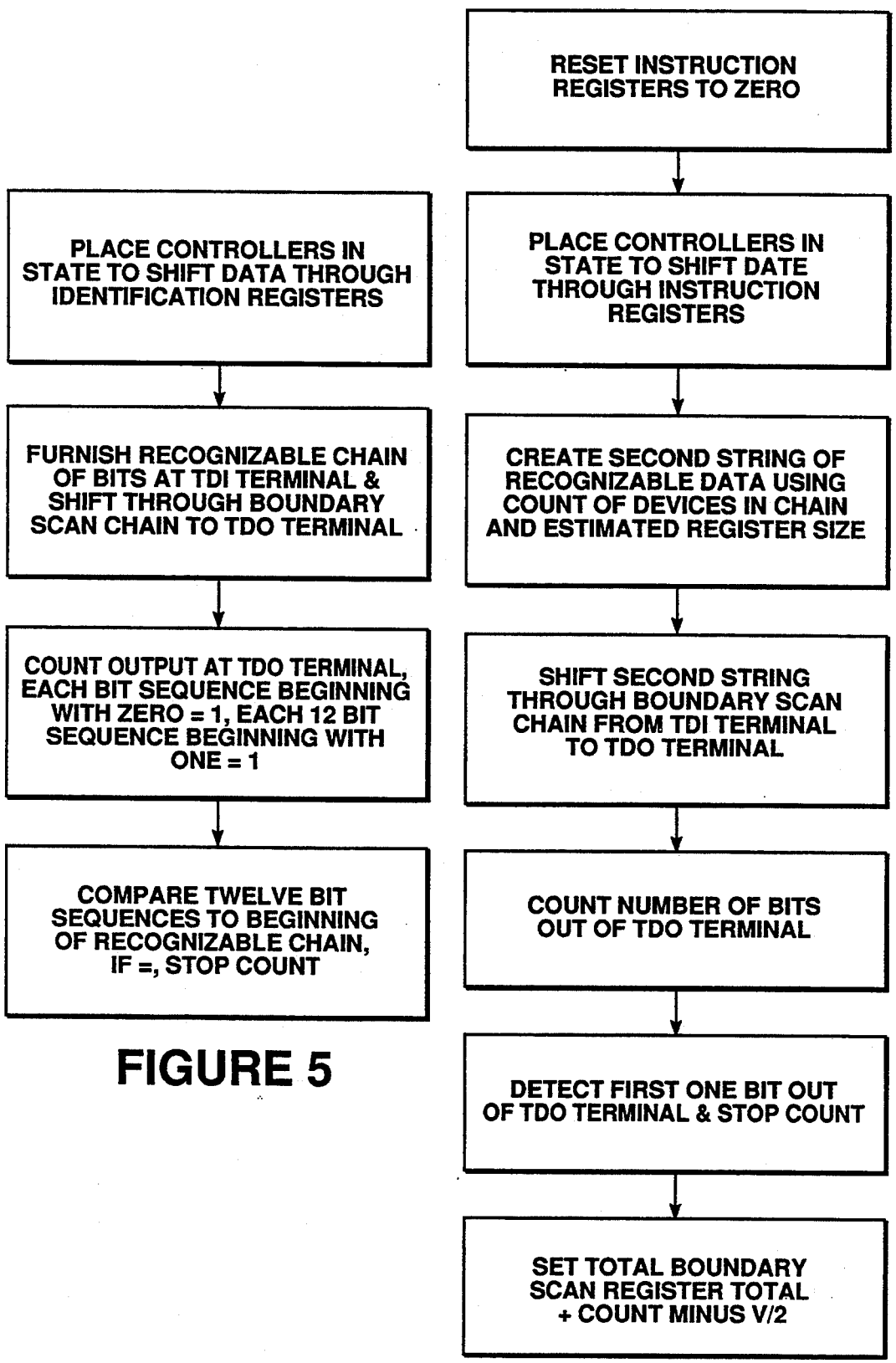
FIG. 5 is a flow chart illustrating a first portion of a method in accordance with the present invention.
FIG. 6 is another flow chart illustrating an additional portion of a method in accordance with the present invention.

FIG. 5 is a flow chart illustrating the steps of a first portion of the method of the present invention. This first portion of the method may be used to determine the total number of devices connected with their relative position within the boundary-scan chain. Typically, prior art circuits required that the information to be derived by this method be embedded in storage circuitry within the integrated circuit so that it might be read out using one of the data registers. Since any number of integrated circuits may be connected in a boundary-scan chain and the information is not always available, the determination of these values in order to utilize the boundary-scan circuitry becomes a real problem. The present method allows the circuitry to be queried to determine how many devices are included and the total register length for the boundary-scan chain. With this information, the boundary-scan circuitry of the particular integrated circuit of interest may be utilized.

The method begins at a first step at which TMS signals are furnished to the boundary-scan chain in the manner described above to place the state machine in the Test-Logic Reset state in which the bypass registers 25 are selected and the values stored in the instruction registers 23 of the individual boundary-scan circuits are reset to zero. Then the controller circuit 20 of each of the individual boundary-scan circuits in the chain is placed in the Shift-DR state through the series of TMS pulses described above. In this state, the path through the boundary-scan circuit of each integrated circuit proceeds through the identification registers 24. As has been pointed out above, if an identification number is provided these registers are twelve bits in length; if an identification number is not provided, these registers are only a single bit long. In the next step, a chain of serial bits are furnished at the TDI terminal to the boundary-scan chain. This chain is selected such that the first eight bits each have a one value. These eight bits are followed by twenty-four bits which each have a value of zero. These bits are in turn followed by a final series of bits having a one value. This final series of bits has a length equal to the number of stages of integrated circuits included in the chain each of which is a one value, a value which is not yet known. This sequence of bits is selected to provide a recognizable series which may be distinguished from any register condition which might otherwise occur.

Since the state machine of each boundary-scan circuit of the chain is in the Shift-DR state, the sequence of bits will be shifted through the chain. The bits will move through the identification registers of each integrated circuit having such a register and through the one bit register which substitutes for the identification register for a circuit without an identification number. As these bits move through the chain, the bits in the chain path including the identification registers will be shifted out to the TDO terminal ahead of the sequence. Each of the one bit registers stores a zero value. Each of the identification registers, on the other hand, includes a twelve-bit value which begins with a one identifying the integrated circuit. It will be seen that in those circuits which include only a one bit register in the path, the transfer of a bit of data through the boundary-scan circuitry of the particular integrated circuit takes only a single clock. On the other hand, if data passes through a twelve bit identification register, it requires twelve clocks to traverse the particular integrated circuit. This knowledge is used in the present method.

A counter at the TDO terminal at the ultimate end of the boundary-scan chain is then set to zero. If the first bit appearing at the TDO terminal is a zero, this indicates that the last integrated circuit in the chain (that nearest the TDO terminal of the circuit board has no twelve bit identification register since a one value prefaces the twelve bit identification number which such a register produces while a zero is produced by a path through a one bit register. This also indicates that a single clock was required for a bit of the sequence to traverse the boundary-scan circuitry of this integrated circuit. The zero value produced is counted alone by the counter (it may be a software counter run as a process by a computer used for the setup) as one integrated circuit. Another zero next appearing is also counted alone as one integrated circuit and is added to the total held by the counter. When a one value is encountered beginning a series of twelve bits, it and the next eleven bits are saved. Since a one indicates that the value prefaced by the one is a twelve bit identification number, these eleven bits together are used to cause the counter to add another one value to indicate another integrated circuit in the chain. Since it takes twelve clock periods to traverse the twelve bit identification register, the twelve bits indicate only a single integrated circuit. Similarly, as the chain of bits moves to the TDO terminal, a zero bit (immediately following a counted zero or a one-prefaced sequence of twelve bits which have been counted) and a sequence of twelve bits (immediately following a counted zero or a one-prefaced sequence of twelve bits which have been counted) is counted as a one value.

Each sequence of twelve bits which is prefaced with a one and is therefore counted is also compared to a pattern of eight ones followed by four zeroes. This pattern is the recognizable pattern which is the beginning of the series of bits furnished to the boundary-scan test chain. When the sequence is detected at the output terminal TDO, the value counted prior to that sequence is the number of integrated circuits in the boundary-scan test chain.

Consequently, by monitoring the output of the TDO terminal, a serial chain of bits will be clocked through the boundary-scan chain from the beginning TDI terminal to the TDO terminal of the last integrated circuit in the chain which will be a series of identification numbers interspersed with zeroes for those integrated circuits without identification numbers. As this chain of bits is counted in the manner indicated until a chain of eight one value bits followed by four zero bits appears, the number of the count will be equal to the number of individual integrated circuits in the chain of integrated circuits having their boundary-scan circuitry connected in series.

FIG. 6 illustrates the second portion of the method. In this portion of the method, TMS signals are furnished to the boundary-scan chain in the manner described above to place the state machine in the Test-Logic Reset state in which the bypass registers 25 are selected and the values stored in the instruction registers 23 are reset to zero. Then the controller circuit 20 of each of the individual boundary-scan circuits in the chain is placed in the Shift-IR state through the series of TMS pulses described above. In this state, the controller circuit 20 shifts data provided at the initial TDI terminal on the circuit board through a path which proceeds through the instruction registers 23 of the boundary-scan circuit of each integrated circuit to the TDO terminal of the final circuit in the chain. Since placing the controller circuits 20 in the Test-Login Reset state causes the values in the instruction register to zeroes, a sequence of zeroes exist in the boundary-scan chain between the beginning TDI terminal and the last TDO terminal.

Then, the number of individual integrated circuits determined in the first portion of the method is used to determine a second recognizable bit string to be placed at the TDI terminal. Essentially, the first count value is multiplied by an expected average register length (e.g., 32 in one embodiment) to give a value V. The value V is used to prepare a second bit string to be furnished at the TDI terminal. The second bit string comprises a first series of zero bit values equal to one-half of this value V of integrated circuits in the chain multiplied by 32. These zeroes are followed by a second series of one values bit again equal in number to one-half of the value V. Since the controller of each boundary-scan circuit is in the Shift-IR state, this second data string is furnished at the TDI terminal and will be shifted toward the TDO terminal. Again, the number of bits are counted as they are furnished, in this case each bit is counted since each bit in the string indicates a position of a instruction register bit in the chain. The output values are again detected. When the first one value is detected at the output, the count of bits less one-half of the value V will be equal to the total number of bits in the chain of boundary-scan registers. Another method adds one-half of the value V to the initial count and then subtracts the total value V from the count once the first one value is detected. Either counted method provides the total number of bits in the chain of boundary-scan registers. This chain length value and the number of integrated circuits included in the chain may then be used with the knowledge that the particular device is the first or the last in the chain to determine the pattern of bits to be furnished in order to affect the operation of the boundary-scan circuitry of the particular integrated circuit.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for determining the number of individual integrated circuit computer chips or the like in a boundary-scan test chain and the length of the chain comprising the steps of placing the controller of each individual boundary-scan circuit in the chain in a state in which a series of bits will traverse a path through an equipment identification register in each individual boundary-scan circuit, sending a first recognizable series of bits through the chain, counting at the output of the chain as one each bit which indicates that an individual boundary-scan circuit has no identification number and each series of bits which indicates an identification number, comparing each series of bits which indicates an identification number with a first portion of the first recognizable series of bits, and ceasing the count when the beginning of the first recognizable series of bits is detected at the output of the chain.

2. A method for determining the number of individual integrated circuit computer chips or the like in a boundary-scan test chain and the length of the chain as claimed in claim 1 further comprising the steps of placing the controller of each individual boundary-scan circuit in the chain in a state in which a series of bits will traverse a path through instruction registers of the individual boundary-scan circuits in the chain, sending a second recognizable series of bits through the chain, counting at the output of the chain as one each bit produced until the beginning of the second recognizable series of bits is detected.

3. A method for determining the number of individual integrated circuit computer chips or the like in a boundary-scan test chain and the length of the chain comprising the steps of placing the controller of each individual boundary-scan circuit in the chain in a state in which a series of bits will traverse a path through an equipment identification register in each individual boundary-scan circuit, sending a series of bits through the chain beginning with eight ones in sequence followed by twenty-four zeroes, counting at the output of the chain as one each zero-valued bit not in a sequence of twelve bits prefaced by a one-valued bit and each series of twelve bits which is prefaced by a one-valued bit, comparing each series of twelve bits which is prefaced by a one-valued bit with the first twelve bits of the series of bits, and ceasing the count when a series of twelve bits at the output compares with the first twelve bits of the series of bits.

4. A method for determining the number of individual integrated circuit computer chips or the like in a boundary-scan test chain and the length of the chain as claimed in claim 3 further comprising the steps of placing the controller of each individual boundary-scan circuit in the chain in a state in which a series of bits will traverse a path through instruction registers of the individual boundary-scan circuits in the chain, sending a second recognizable series of bits through the chain, and counting at the output of the chain as one each bit produced until the beginning of the second recognizable series of bits is detected.

5. A method for determining the number of individual integrated circuit computer chips or the like in a boundary-scan test chain and the length of the chain as claimed in claim 4 further comprising the step of setting the values in the instruction registers of the individual boundary-scan circuits in the chain to zero, and in which the step of sending a second recognizable series of bits through the chain comprises sending a first sequence of zero-valued bits equal to the number of circuits in the boundary scan chain multiplied by the average number of bit positions in a register in the chain followed by a second sequence of one-valued bits equal to the number of circuits in the boundary scan chain multiplied by the average number of bit positions in a register in the chain.

* * * * *